United States Patent
Chan et al.

(10) Patent No.: US 10,068,967 B2
(45) Date of Patent: Sep. 4, 2018

(54) SELF-FORMING SPACERS USING OXIDATION

(71) Applicant: International Business Machines Corporation, Armonk, NY (US)

(72) Inventors: Kevin K. Chan, Staten Island, NY (US); Masaharu Kobayashi, Tokyo (JP); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/604,719

(22) Filed: May 25, 2017

(65) Prior Publication Data

US 2017/0263702 A1    Sep. 14, 2017

Related U.S. Application Data

(62) Division of application No. 14/492,123, filed on Sep. 22, 2014, now Pat. No. 9,773,865.

(51) Int. Cl.
| | |
|---|---|
| *H01L 29/06* | (2006.01) |
| *H01L 29/66* | (2006.01) |
| *H01L 29/78* | (2006.01) |
| *H01L 21/38* | (2006.01) |
| *H01L 21/34* | (2006.01) |
| *H01L 21/02* | (2006.01) |
| *H01L 21/311* | (2006.01) |
| *H01L 21/321* | (2006.01) |

(52) U.S. Cl.
CPC ...... *H01L 29/0649* (2013.01); *H01L 21/0262* (2013.01); *H01L 21/34* (2013.01); *H01L 21/38* (2013.01); *H01L 29/66545* (2013.01); *H01L 29/66795* (2013.01); *H01L 29/785* (2013.01); *H01L 21/31111* (2013.01); *H01L 21/32105* (2013.01)

(58) Field of Classification Search
None
See application file for complete search history.

(56) References Cited

U.S. PATENT DOCUMENTS

| | | | |
|---|---|---|---|
| 5,847,428 A | 12/1998 | Fulford, Jr. et al. | |
| 5,854,505 A | 12/1998 | Suzuki et al. | |
| 6,136,664 A | 10/2000 | Economikos et al. | |
| 6,144,071 A | 11/2000 | Gardner et al. | |
| 6,348,379 B1 | 2/2002 | Wang et al. | |
| 6,509,229 B1 | 1/2003 | Wang et al. | |

(Continued)

OTHER PUBLICATIONS

IBM: List of IBM Patents or Patent Applications Treated As Related (Appendix P), May 25, 2017, 2 pages.

(Continued)

*Primary Examiner* — Jay C Chang
(74) *Attorney, Agent, or Firm* — L. Jeffrey Kelly

(57) ABSTRACT

A method of forming a self-forming spacer using oxidation. The self-forming spacer may include forming a fin field effect transistor on a substrate, the fin field effect transistor includes a gate on a fin, the gate is perpendicular to the fin; forming a gate spacer on the gate and a fin spacer on the fin, the gate spacer and the fin spacer are formed in a single step by oxidizing an exposed surface of the gate and an exposed surface of the fin; and removing the fin spacer from the fin.

17 Claims, 5 Drawing Sheets

(56) References Cited

U.S. PATENT DOCUMENTS

| | | | |
|---|---|---|---|
| 7,125,805 B2 | 10/2006 | Chen et al. | |
| 7,439,607 B2 | 10/2008 | Ballantine et al. | |
| 7,659,561 B2 | 2/2010 | Kwon | |
| 2005/0077574 A1* | 4/2005 | Mouli | H01L 27/108 257/347 |
| 2006/0172497 A1 | 8/2006 | Hareland et al. | |
| 2006/0252204 A1 | 11/2006 | Han et al. | |
| 2007/0111435 A1 | 5/2007 | Kim et al. | |
| 2008/0176384 A1 | 7/2008 | Ko | |
| 2010/0078733 A1 | 4/2010 | Masuoka et al. | |
| 2012/0306002 A1 | 12/2012 | Yeh et al. | |
| 2013/0277752 A1 | 10/2013 | Glass et al. | |
| 2013/0307088 A1 | 11/2013 | Yang et al. | |
| 2014/0103455 A1* | 4/2014 | Ando | H01L 29/66795 257/410 |
| 2014/0124873 A1* | 5/2014 | Jagannathan | H01L 29/49 257/407 |
| 2014/0131831 A1 | 5/2014 | Wei et al. | |
| 2015/0017774 A1 | 1/2015 | Tong et al. | |
| 2016/0086796 A1 | 3/2016 | Chan et al. | |

OTHER PUBLICATIONS

Kobayashi et al., "Radical oxidation of germanium for interface gate dielectric GeO2 formation in metal-insulator-semiconductor gate stack", Journal of Applied Physics, vol. 106, No. 10, 104117, 2009, pp. 104117-1-104117-7.

Sekine et al., "Highly Reliable Ultrathin Silicon Oxide Film Formation at Low Temperature by Oxygen Radical Generated in High-Density Krypton Plasma", IEEE Transactions on Electron Devices, Vol. 48, No. 8, Aug. 2001, pp. 1550-1555.

* cited by examiner

SELF-FORMING SPACERS USING OXIDATION

BACKGROUND

The present invention generally relates to semiconductor device manufacturing, and more particularly to fabrication of a gate spacer using oxidation.

Sidewall spacers provide many fundamental functions in semiconductor processing. For example, typically following gate structure formation, a source/drain extension implantation process is performed in order to form source/drain extension regions with relatively low doping levels immediately adjacent to a gate structure. Next, gate sidewall spacers are formed. These gate sidewall spacers subsequently function as masks (i.e., as shields) during a source/drain region implantation process. The source/drain region implant process forms source/drain regions with relatively high doping levels offset from the gate structure by the width of the gate sidewall spacers (i.e., aligned to the gate sidewall spacers). Such sidewall spacers may similarly be used as masks (i.e., as shields) during other process steps, including but not limited to, salicide formation and/or etch steps.

Sidewall spacers are typically formed by conformally depositing one or more layers of dielectric materials, such as an oxide (e.g., silicon dioxide) and/or a nitride (e.g., silicon nitride), to a desired thickness. However, the conformal deposition results in less material being deposited around the top corners of the gate structure, with rounding occurring. Then, an anisotropic etch process is performed to remove the dielectric material from the horizontal surfaces. While the etch process is selected to be anisotropic, the resulting sidewall spacers are inevitably tapered (i.e., not uniform) as a result of different deposition rates and etching rates near the upper and lower corners of the gate structure. Furthermore, as device sizes are scaled, devices (e.g., fins or gates) may become more vulnerable to defects as an indirect result of spacer etching.

SUMMARY

According to one embodiment of the present invention, a method of forming a self-forming gate spacer is provided. The method may include forming a fin field effect transistor on a substrate, the fin field effect transistor includes a gate on a fin, the gate is perpendicular to the fin; forming a gate spacer on the gate and a fin spacer on the fin, the gate spacer and the fin spacer are formed in a single step by oxidizing an exposed surface of the gate and an exposed surface of the fin; and removing the fin spacer from the fin.

According to another embodiment of the present invention, a method of forming a self-forming gate spacer is provided. The method may include forming a semiconductor-on-insulator substrate, the semiconductor-on-insulator substrate includes an SOI layer, a buried dielectric layer and a base substrate, the SOI layer is on the buried dielectric layer, the buried dielectric layer is on the base substrate; forming a fin in the SOI layer; forming a dummy gate layer on the fin; forming a dummy gate by patterning the dummy gate layer using a hardmask, the dummy gate is perpendicular to the fin; forming an oxide layer on the dummy gate and on the fin using an oxidation process, a gate spacer is a portion of the oxide layer on the dummy gate, a fin spacer is a portion of the oxide layer on the fin; and removing the fin spacer using a water wet etch.

According to another embodiment of the present invention, a structure of a self-forming gate spacer is provided.

The structure may include a fin field effect transistor comprising a gate and a fin, the gate and the fin are on a substrate, the gate is on the fin and the gate is perpendicular to the fin; and a gate spacer on the gate, the gate spacer is an oxide, the gate spacer wraps around the fin.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
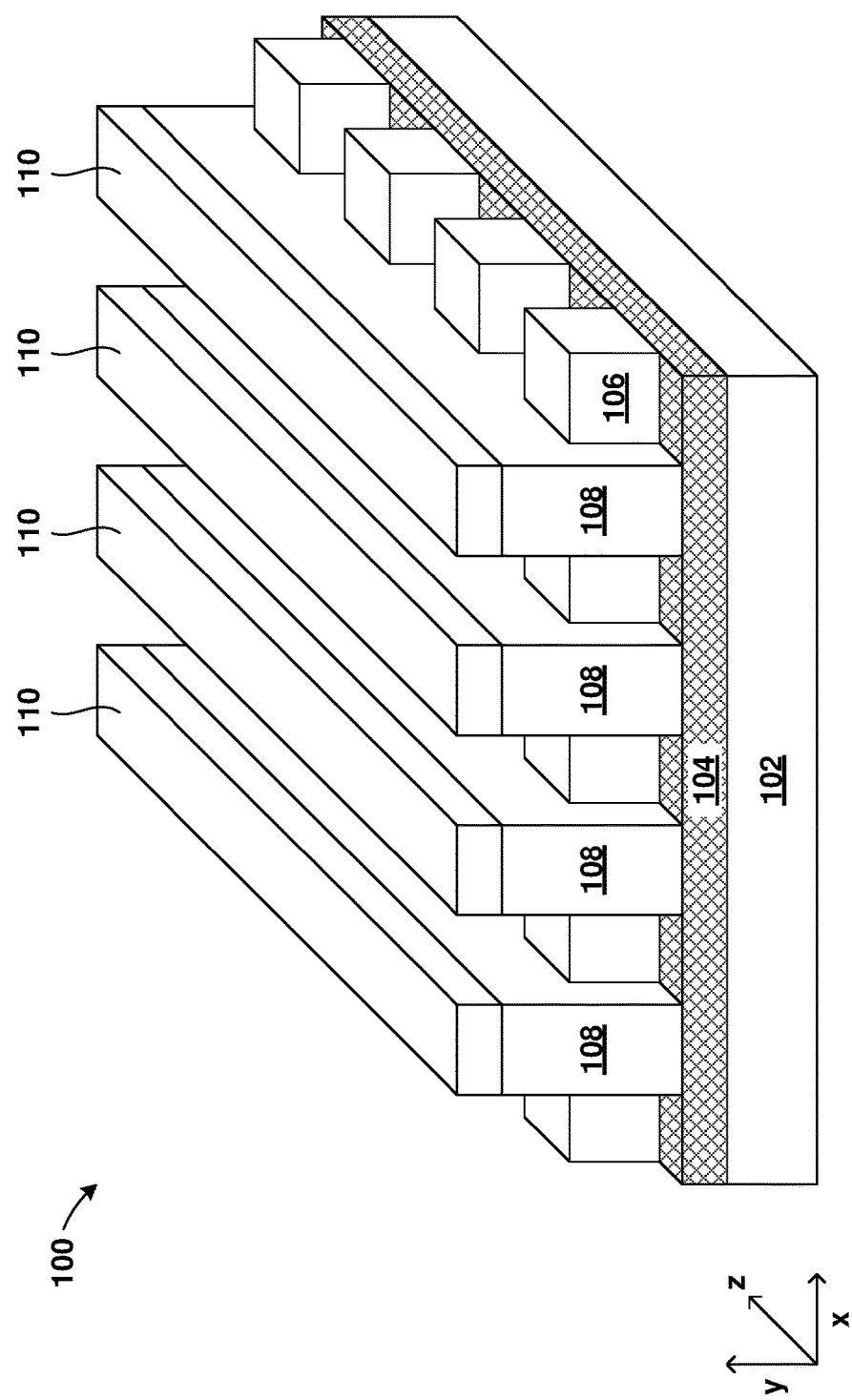
FIG. 1 is an isometric view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly, fabrication of a gate spacer using oxidation. Ideally, it may be desirable to form a spacer on a gate without damaging or altering surrounding components (e.g., fins). The purpose of using oxidation to form a spacer is to retain spacer formation on a desired component (e.g., on a gate) while allowing undesirable spacer formation (e.g., on fins) to be easily removed using non-destructive, or less destructive, removal techniques, such as wet etching rather than reactive ion etching (RIE). One way to form a spacer using oxidation is to oxidize a dummy gate and fins forming a gate spacer including silicon dioxide (resistant to a wet etch) and a fin spacer including germanium oxide (easily removed using a wet etch). One embodiment by which to form a spacer using oxidation is described in detail below with reference to the accompanying drawings FIGS. 1-7. It should be noted, the present invention may also be used for other devices, such as, for example, planar devices or nanowires. Additionally, the present invention may be utilized in other spacer formation techniques, such as, for example, gate first techniques.

Figure 2:
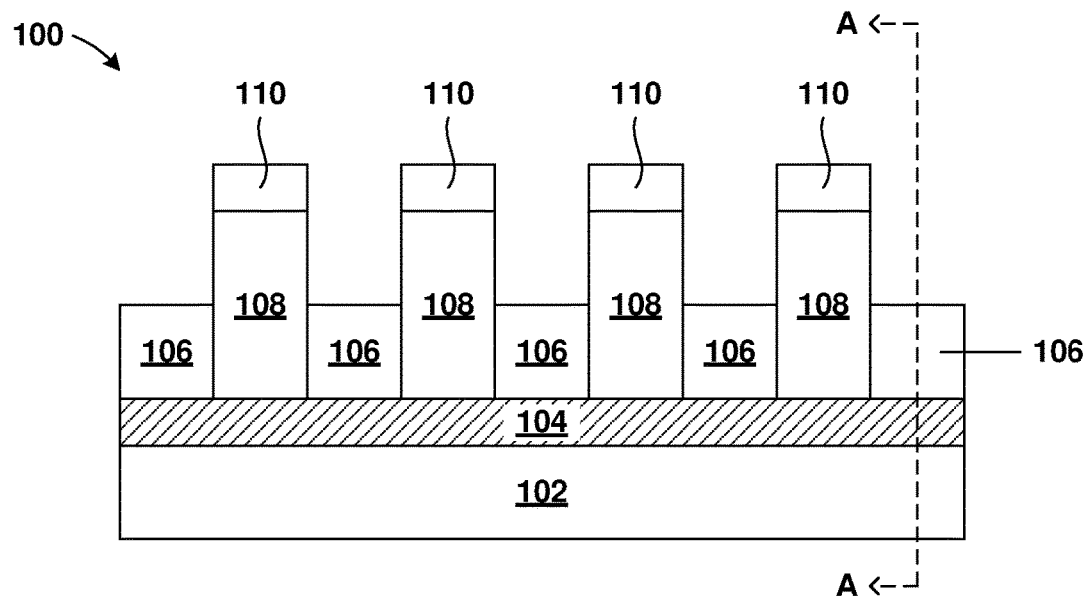
FIG. 2 is a front view of the semiconductor structure illustrated in FIG. 1, according to an exemplary embodiment.
Figure 3:
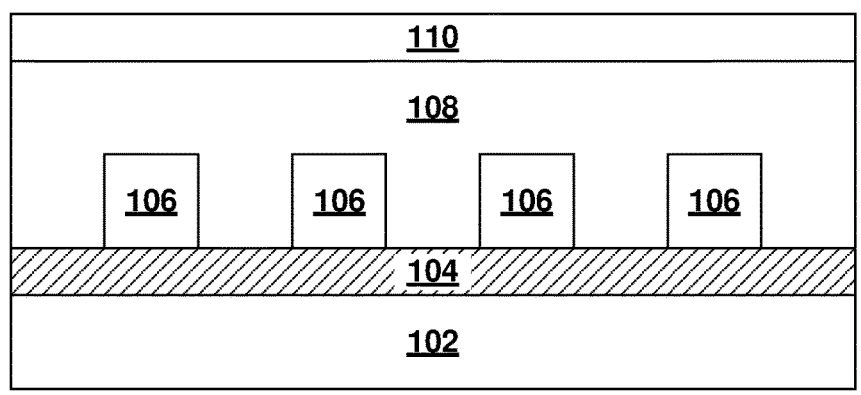
FIG. 3 is a side view of the semiconductor structure illustrated in FIG. 2, according to an exemplary embodiment.

FIGS. 1-3 are demonstrative illustrations of a structure 100 during an intermediate step of a method of fabricating a spacer using oxidation. More specifically, the method can start with forming a dummy gate 108 and a fin 106. FIG. 1 illustrates an isometric view of the structure 100. FIG. 2 illustrates a front view of the structure 100 illustrated in FIG. 1 taken along the x-y plane. FIG. 3 is a side view of the structure 100 illustrated in FIG. 2 taken along section line A-A. It should be noted, the fin 106 is illustrated as a silicon-on-insulator (SOI) layer, however, the fin 106 may be in any material or substrate, such as, for example, in a bulk substrate.

The SOI substrate employed in the exemplary embodiment may include a base substrate 102, a buried dielectric layer 104, and an SOI layer. The SOI layer may be on the buried dielectric layer 104, where the buried dielectric layer 104 is on the base substrate 102. The buried dielectric layer 104 may electrically isolate the SOI layer from the base substrate 102. The SOI substrate may be formed utilizing standard processes including, for example, separation by ion implantation of oxygen (SIMOX) or layer transfer. When a layer transfer process is employed, an optional thinning step may follow the bonding of two semiconductor wafers together.

The base substrate 102 may be made from any of several known semiconductor materials, such as, for example; silicon, germanium, silicon-germanium alloy, silicon carbide, silicon-germanium carbide alloy, and compound (e.g. III-V and II-VI) semiconductor materials. Typically the base substrate 102 may be several hundred microns thick, but other thicknesses may be employed. For example, the base substrate 102 may include a thickness ranging from about 0.5 mm to about 1.5 mm.

The buried dielectric layer 104 may be formed on the base substrate 102 using any techniques known in the art, such as, for example; ion implantation, thermal or plasma oxidation or nitridation, chemical vapor deposition and physical vapor deposition. The buried dielectric layer 104 may be any dielectric material known in the art, such as, for example; oxides, nitrides and oxynitrides of silicon. Oxides, nitrides and oxynitrides of other elements may also be employed. In addition, the buried dielectric layer 104 may include crystalline or non-crystalline dielectric material. The buried dielectric layer 104 may include a thickness ranging from about 10 nm to about 500 nm, but other thicknesses may also be employed. In one embodiment, the buried dielectric layer 104 may be about 150 nm thick.

The SOI layer may include any of the several semiconductor materials described above, with reference to the base substrate 102. The base substrate 102 and the SOI layer may include similar or different semiconducting materials with respect to chemical composition, dopant concentration and crystallographic orientation. In an embodiment, the SOI layer may be germanium. The SOI layer may include a thickness ranging from about 5 nm to about 100 nm. The SOI layer may be used to form device components, such as, for example, a fin used in fin field effect transistors (fin-FET's).

In the exemplary embodiment, the fin 106 may be formed in the SOI layer of the SOI substrate using any fin formation technique known in the art, such as, for example, mask and etch or sidewall image transfer. Alternatively, the fin 106 may include multiple layers in addition to the SOI layer of the SOI substrate. For example, an oxide layer (not shown) and a nitride layer (not shown) may be formed on a top surface of the SOI layer, where the nitride layer may be located directly on the oxide layer. The fin 106 may be any known fin material known in the art, such as the semiconductor materials described above, with reference to the base substrate 102 and the SOI layer.

With further reference to FIGS. 1-3, the dummy gate 108 may be formed on the fin 106 using any deposition technique known in the art, such as, for example, atomic layer deposition (ALD), molecular layer deposition (MLD), chemical vapor deposition (CVD), physical vapor deposition (PVD), and spin on techniques followed by deposition, patterning, and etching of a hardmask 110. The dummy gate 108 may be perpendicular to the fin 106. The dummy gate 108 may be any suitable dummy gate material known in the art, such as, for example, polysilicon, amorphous silicon, or any other known materials that can be oxidized. In an embodiment, the dummy gate 108 may be polysilicon. The dummy gate 108 may have a thickness ranging from about 30 nm to about 100 nm and ranges there between, although a thickness less than 30 nm and greater than 100 nm may be acceptable.

The hardmask 110 may also be deposited using typical deposition techniques, for example, atomic layer deposition (ALD), molecular layer deposition (MLD), chemical vapor deposition (CVD), physical vapor deposition (PVD), and spin on techniques. The hardmask 110 may include any photolithographic masking material known in the art, for example, a nitride. The hardmask 110 may have a thickness ranging from about 5 nm to about 30 nm and ranges there between, although a thickness less than 5 nm and greater than 30 nm may be acceptable.

Figure 4:
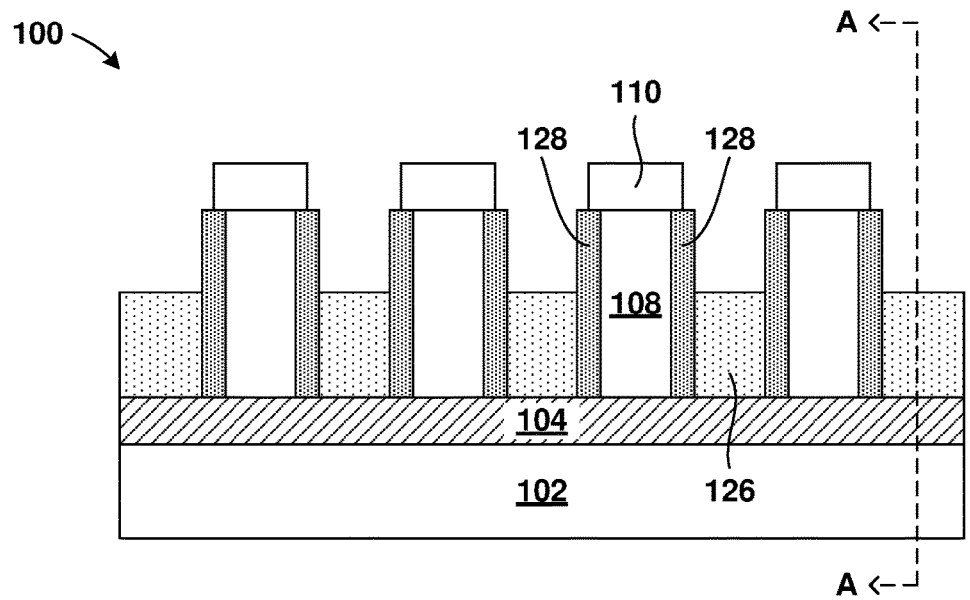
FIG. 4 is a front view of the semiconductor structure and illustrates the formation of an oxide layer on a gate and a fin, according to an exemplary embodiment.
Figure 5:
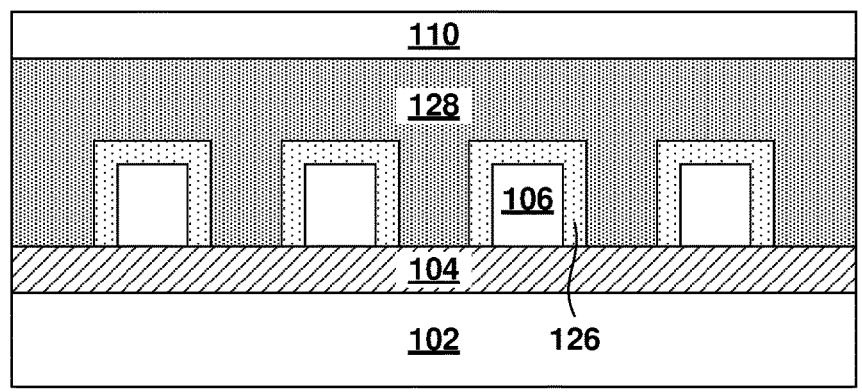
FIG. 5 is a side view of the semiconductor structure illustrated in FIG. 4, according to an exemplary embodiment.

FIGS. 4 and 5 are demonstrative illustrations of a structure 100 during an intermediate step of a method of fabricating a spacer using oxidation. More specifically, the method can include oxidizing an exposed surface of the dummy gate 108 and an exposed surface of the fin 106. FIG. 5 is a side view of the structure 100 illustrated in FIG. 4 taken along section line A-A.

As stated above, a typical deposition and etching technique may be used to form a nitride gate spacer by, for example, conformally depositing a nitride layer on a dummy gate and on a fin followed by an etching step (e.g., RIE) to remove the spacer layer from the fin (i.e., leaving the nitride layer on the gate acting as a gate spacer). Typically, the nitride layer on the dummy gate and on the fin is a uniform composition across the different components. If the nitride layer is a uniform nitride material across the dummy gate and the fin, a destructive removal process, such as, mask and RIE, may be required to remove undesirable portions of the nitride layer (e.g., the nitride layer covering the fin). As device components are scaled, a non-destructive, or less destructive, spacer removal technique may be desirable. Less destructive removal techniques may control the amount of over-etching caused by the removal process.

In the present embodiment, an oxidation process may be used to form an oxide layer (spacer layer) on the dummy gate 108 and on the fin 106 where the oxide layer includes different compounds covering the dummy gate 108 and the fin 106. In an embodiment, the oxide layer may include a gate spacer 128 on the dummy gate 108 and a fin spacer 126 on the fin 106, where the gate spacer 128 may be silicon dioxide (if the gate 108 is polysilicon) and the fin spacer 126 may be germanium oxide (if the fin 106 is germanium). If the oxide layer includes both silicon dioxide and germanium oxide, the germanium oxide may be removed using a water wet etch leaving the silicon dioxide on the dummy gate 108. A water wet etch process may not be as destructive as RIE, allowing for scaling of components and preventing over-etching or other adverse effects generally caused during more destructive etching techniques.

The dummy gate 108 and the fin 106 may be oxidized using any oxidation technique known in the art, such as, for example, rapid thermal oxidation, high pressure wet oxidation, or low temperature oxidation. The oxidation technique used may grow oxide both on the dummy gate 108 and the fin 106 as well as into a portion of the dummy gate 108 and into a portion of the fin 106, as is known in the art.

In an embodiment, a rapid thermal oxidation technique may be used to oxide the surface of the dummy gate 108 and the surface of the fins 106 to form the oxide layer. Rapid thermal oxidation may be controlled to create an oxide on, at least, a portion of the exposed material. In other words, the oxide may cover multiple exposed materials on a structure. One factor that may control the thickness of the oxide as well as the percentage of the materials covered by the oxide is a desired beta value. Among the variables that may be controlled in the rapid thermal oxidation process are temperature and time. According to one embodiment, the rapid thermal oxidation process is carried out at about 500° C. The rapid thermal oxidation process may be carried out for about 5 seconds.

In another embodiment, a high pressure wet oxidation technique may be used to oxide the surface of the dummy gate 108 and the surface of the fins 106 to form the oxide layer. High pressure wet oxidation may use $H_2O$ and $O_2$ at a pressure from 5-20 atmospheres and at a temperature from 650-800° C.

In another embodiment, a low temperature oxidation technique may be used to oxide the surface of the dummy gate 108 and the surface of the fins 106 to form the oxide layer. Low temperature oxidation may be capable of converting polycrystalline Si and/or Ge into an oxide. The low temperature oxidation process may be performed at a temperature of about 700° C., or less. More typically, the low temperature oxidation process is performed 500° C. to about 700° C. The low temperature oxidation process can be performed utilizing any oxidation process that is capable of operation at the above temperature range. For example, the oxidation may include, in one preferred low temperature oxidation process is a high pressure oxidation (HIPOX) process.

Once the structure 100 undergoes the oxidation process, the oxide layer may remain on the exposed surface of the dummy gate 108 and on the exposed surface of the fin 106. The oxide layer may not grow on the hardmask 110 and the buried dielectric layer 104 if oxide resistant materials are chosen for the hardmask 110 and the buried dielectric layer 104, such as, for example, silicon dioxide or silicon nitride.

Some current techniques utilize epitaxial growth to form spacers on gates and fins, however, epitaxial growth typically forms a single material or compound across all components. Using oxidation to form different oxide compounds across different components is beneficial when it is desirable to remove a portion of the spacer layer from one component (i.e., the fin) and not from another (i.e., the gate).

Figure 6:
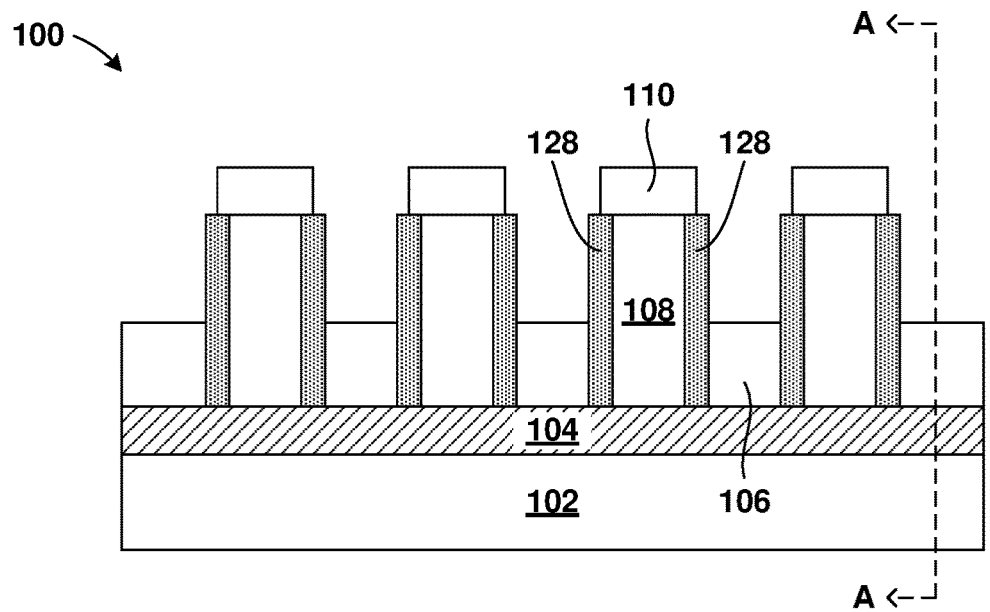
FIG. 6 is a front view of the semiconductor structure and illustrates the removal of the oxide layer from the fin, according to an exemplary embodiment.
Figure 7:
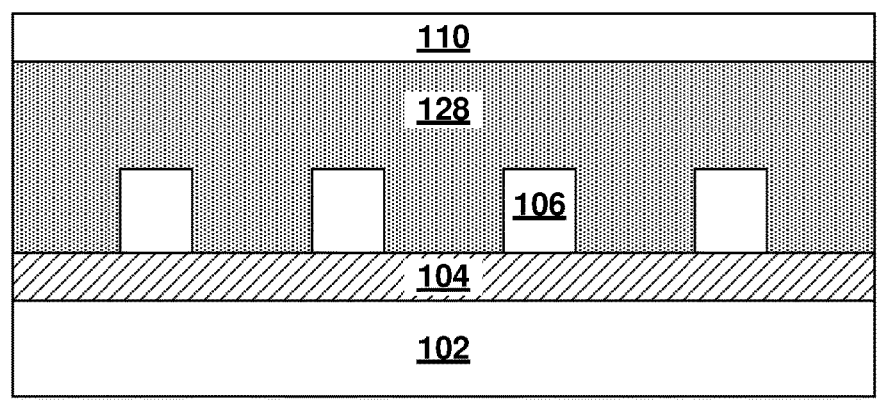
FIG. 7 is a side view of the semiconductor structure illustrated in FIG. 6, according to an exemplary embodiment.

FIGS. 6 and 7 are demonstrative illustrations of a structure 100 during an intermediate step of a method of fabricating a spacer using oxidation. More specifically, the method can include removing the fin spacer 126 (illustrated in FIGS. 4 and 5). FIG. 7 is a side view of the structure 100 illustrated in FIG. 6 taken along section line A-A.

As stated above, typical deposition and etching techniques used to form gate spacers utilize etching techniques such as RIE. RIE may be destructive to a fin and may remove a portion of the fin during the spacer removal process. A benefit to utilizing oxidation to form a gate spacer and a fin spacer is that different oxides may be formed on different materials depending on the material. Different oxides allow for different removal techniques that are non-destructive, or less destructive, than RIE, such as, for example, a water wet etch to remove one oxide without removing another.

The fin spacer 126 may be removed using any oxide removal technique known in the art, such as, for example, a water wet etch. In an embodiment, the fin spacer 126 may be germanium oxide and the gate spacer 128 may be silicon dioxide, where the fin spacer 126 may be easily removable using a water wet etch, and where the gate spacer 128 may remain on the structure 100 because of the relative durability of silicon dioxide against a water wet etch. In an exemplary embodiment, the fin spacer 126 may be removed without using any destructive etching (i.e., RIE), which, as stated above, will lower the likelihood of effecting or degrading the fin 106 or gate spacer 128 during the removal process.

Figure 8:
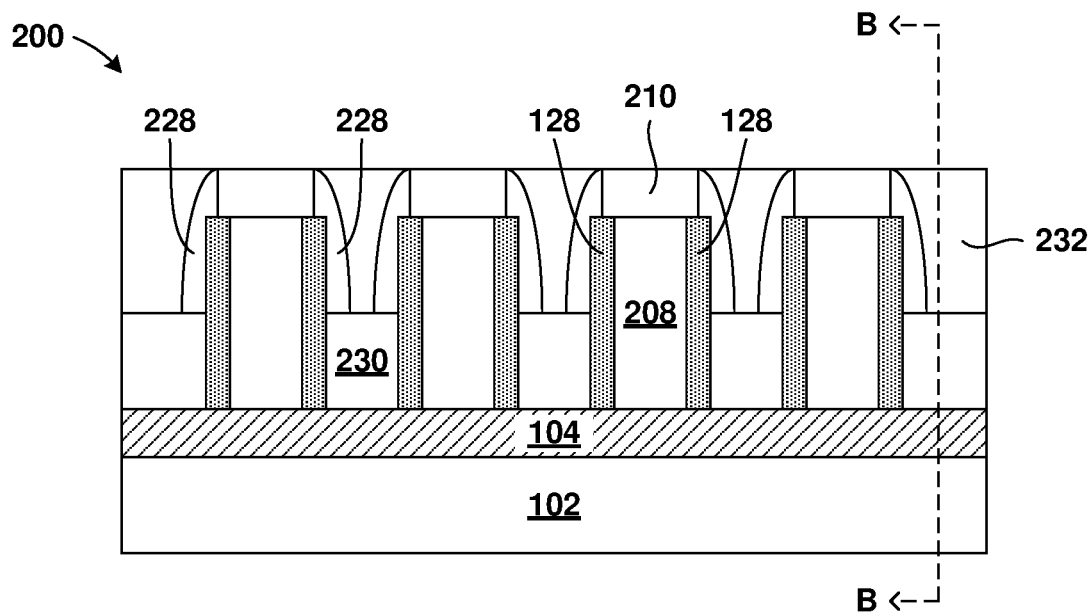
FIG. 8 is a front view of the semiconductor structure and illustrates the formation of a second spacer, according to an alternative embodiment.
Figure 9:
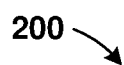
FIG. 9 is a side view of the semiconductor structure illustrated in FIG. 8, according to an alternative embodiment.

FIGS. 8 and 9 are demonstrative illustrations of a structure 200 during a subsequent step after a method of fabricating a spacer using oxidation. More specifically, the dummy gate 108 may be replaced with a metal gate 208. FIG. 9 is a side view of the structure 200 illustrated in FIG. 8 taken along section view line B-B.

In an embodiment, an epitaxy source-drain 230 may be formed on the fin 106. An optional second spacer 228 may be formed on a sidewall of the hardmask 110 and on an exposed portion of the gate spacer 128. The exposed portion of the gate spacer 128 may be a portion of the gate spacer 128 that is above the epitaxy source-drain 230. An insulator 232 may be deposited on the epitaxy extension 230, on the hardmask 110, and on the second spacer 228. The insulator 232 may be polished or recessed to a top surface of the hardmask 110. The hardmask 110 and the dummy gate 108 may be removed. The metal gate 208 may be deposited in-between the gate spacers 128. The metal gate 208 may include a filler metal such as tungsten (W), a metal liner such as titanium nitride (TiN) and/or a gate dielectric. A cap 210 may be deposited on the metal gate 208.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
 a metal gate perpendicular to a fin, the metal gate covers three sides of the fin;
 a pair of oxide spacers on opposite sidewalls of the metal gate perpendicular to the fin, wherein the pair of oxide spacers and the metal gate are equal in height;
 a nitride gate cap above and in direct contact with uppermost surfaces of both the metal gate and the pair of oxide spacers; and
 a pair of nitride spacers on opposite sidewalls of the nitride gate cap and in direct contact with an epitaxial source-drain region above the fin, the pair of nitride spacers have a stepped profile where they interface with the nitride gate cap and the pair of oxide spacers.

2. The semiconductor structure of claim 1, wherein a lateral width of the nitride gate cap is greater than a lateral width of the metal gate but less than a total width of the metal gate including the pair of oxide spacers.

3. The semiconductor structure of claim 1, further comprising:
 epitaxy source drain regions above and in direct contact with portions of the fin not covered by both the metal gate and the pair of oxide spacers such that the pair of oxide spacers separate the epitaxy source drain regions from directly contacting the metal gate.

4. The semiconductor structure of claim 1, wherein both the fin and the metal gate are above and in direct contact with a buried dielectric layer of a silicon-on-insulator substrate.

5. The semiconductor structure of claim 1, wherein a portion of the fin directly beneath the metal gate has a similar profile to a portion of the fin not covered by the metal gate.

6. The semiconductor structure of claim 1, wherein the pair of oxide spacers are silicon dioxide and the fin comprises germanium.

7. A semiconductor structure comprising:
 a metal gate perpendicular to a fin, the metal gate covers three sides of the fin;
 a pair of oxide spacers on opposite sidewalls of the metal gate perpendicular to the fin, wherein the pair of oxide spacers and the metal gate are equal in height and the pair of oxide spacers have a uniform width across their entire height;
 a nitride gate cap above and in direct contact with both the metal gate and the pair of oxide spacers; and
 a pair of nitride spacers on opposite sidewalls of the nitride gate cap and in direct contact with an epitaxial source-drain region above the fin, the pair of nitride spacers have a stepped profile where they interface with the nitride gate cap and the pair of oxide spacers.

8. The semiconductor structure of claim 7, wherein a lateral width of the nitride gate cap is greater than a lateral width of the metal gate but less than a total width of the metal gate including the pair of oxide spacers.

9. The semiconductor structure of claim 7, further comprising:
 epitaxy source drain regions above and in direct contact with portions of the fin not covered by both the metal gate and the pair of oxide spacers such that the pair of oxide spacers separate the epitaxy source drain regions from directly contacting the metal gate.

10. The semiconductor structure of claim 7, wherein both the fin and the metal gate are above and in direct contact with a buried dielectric layer of a silicon-on-insulator substrate.

11. The semiconductor structure of claim 7, wherein a portion of the fin directly beneath the metal gate has a similar profile to a portion of the fin not covered by the metal gate.

12. The semiconductor structure of claim 7, wherein the pair of oxide spacers are silicon dioxide and the fin comprises germanium.

13. A semiconductor structure comprising:
 a metal gate perpendicular to a fin, the metal gate covers three sides of the fin;
 a pair of oxide spacers on opposite sidewalls of the metal gate perpendicular to the fin, wherein the pair of oxide spacers and the metal gate are equal in height and the pair of oxide spacers have a uniform width across their entire height; and
 a nitride gate cap above and in direct contact with uppermost surfaces of both the metal gate and the pair of oxide spacers, wherein a lateral width of the nitride gate cap is greater than a lateral width of the metal gate but less than a total width of the metal gate including the pair of oxide spacers; and
 a pair of nitride spacers on opposite sidewalls of the nitride gate cap and in direct contact with an epitaxial source-drain region above the fin.

14. The semiconductor structure of claim 13, further comprising:
 epitaxy source drain regions above and in direct contact with portions of the fin not covered by both the metal gate and the pair of oxide spacers such that the pair of oxide spacers separate the epitaxy source drain regions from directly contacting the metal gate.

15. The semiconductor structure of claim 13, wherein both the fin and the metal gate are above and in direct contact with a buried dielectric layer of a silicon-on-insulator substrate.

16. The semiconductor structure of claim 13, wherein the pair of oxide spacers are silicon dioxide and the fin comprises germanium.

17. The semiconductor structure of claim 13, wherein a portion of the fin directly beneath the metal gate has a similar profile to a portion of the fin not covered by the metal gate.

* * * * *